United States Patent
Forrester et al.

(10) Patent No.: US 7,574,010 B2
(45) Date of Patent: Aug. 11, 2009

(54) SYSTEM AND METHOD FOR ADJUSTING AN AUDIO SIGNAL

(75) Inventors: Christopher Forrester, Kitchener (CA); Larry Hawker, Waterloo (CA); Bao Nguyen, Waterloo (CA)

(73) Assignee: Research in Motion Limited, Waterloo, Ontario (CA)

( * ) Notice: Subject to any disclaimer, the term of this patent is extended or adjusted under 35 U.S.C. 154(b) by 976 days.

(21) Appl. No.: 10/855,407

(22) Filed: May 28, 2004

(65) Prior Publication Data
US 2005/0276425 A1   Dec. 15, 2005

(51) Int. Cl.
H03G 3/00 (2006.01)

(52) U.S. Cl. .......................... 381/104; 381/57; 700/94; 455/232.1

(58) Field of Classification Search ................. 381/104, 381/107, 105, 106, 108, 109, 56, 57; 700/94; 455/355, 219, 232.1
See application file for complete search history.

(56) References Cited

U.S. PATENT DOCUMENTS 4,721,923 A   1/1988   Bares et al.
5,245,668 A   9/1993   Kirchlechner
6,011,853 A * 1/2000   Koski et al. .................... 381/56
6,487,529 B1* 11/2002  Miet .......................... 704/233

FOREIGN PATENT DOCUMENTS

| EP | 0674415 A1 | 9/1995 |
| EP | 0767570 A2 | 4/1997 |
| WO | WO 98/23086 | 5/1998 |
| WO | WO 2004/004409 A1 | 1/2004 |

* cited by examiner

Primary Examiner—Vivian Chin
Assistant Examiner—Con P Tran
(74) Attorney, Agent, or Firm—McCarthy Tétrault LLP

(57) ABSTRACT

Disclosed is a system and method of adjusting an audio signal for a communication device. The method comprises: identifying a characteristic associated with the signal and identifying its quality threshold; identifying a first set of adjustment parameters for the signal when the threshold is exceeded; and identifying a second set of adjustment parameters when it is not exceeded. Also, the device: monitors for a current setting value for the characteristic; and detects whether the current setting value is above or below the quality threshold. If the value is above, then the device produces a first output signal value utilizing a DSP, a processing filter defined in the DSP, values of the first set of adjustment parameters and the signal value. If the value is below, the device produces a second output signal value utilizing the DSP, the filter, values of the second set of adjustment parameters and the signal value.

18 Claims, 5 Drawing Sheets

Note that this algorithm only illustrates the decision process for selecting one of two sets of coefficients based on one volume threshold. It can be extended to apply to n sets of coefficients with n-1 volume thresholds

SYSTEM AND METHOD FOR ADJUSTING AN AUDIO SIGNAL

FIELD OF INVENTION

The invention relates to a system and method for adjusting an audio signal, in particular an audio signal generated by a speaker in a communication device.

BACKGROUND

In electronics, an audible audio signal is generated by generating an electrical signal representative of the audible signal and feeding that signal to a speaker. Various adjustments can be applied to the audio signal, including changing its volume, pitch and frequency, using known analog and digital signal processing techniques.

For a communication device, such as a cellular phone, a current feature provides a volume setting which selectively increases and decreases volume of an audio signal generated by the device's speaker. For a user of a cellular phone who has hearing difficulties, when he talks on the phone, the phone's volume setting may be placed at a "high" volume level, to increase the audio signal of the person calling the user. Alternatively, the volume setting may be set at a sufficiently high level to enable the user to listen to the audio signal generated by the cellular phone without requiring that the cellular phone be placed immediately near the user's ear. This setting is useful when the user checks his voice mail system. Therein, with a high volume level, he can hold the cellular phone in front of him and listen to his messages while still being able to see the keypad of the cellular phone. This enables him to see the keypad and quickly access the appropriate keys as he navigates through the commands of the voice mail system.

Increasing the volume on a cellular phone past a threshold level introduces distortion to the generated audio signal, thereby making it difficult to understand.

Known signal processing techniques provide dynamic monitoring of audio signals to dynamically recognize when an audio signal has excessive distortion and then provide a corrective shaping signal to it to reduce the distortion. Such techniques work very well, but use sophisticated evaluation techniques which require a significant amount of signal processing capabilities to implement them in real time. Smaller devices, such as cellular phones, have limited signal processing capabilities, and may not have sufficient capabilities to implement these techniques.

There is a need for a system and method of adjusting an audio signal in an efficient manner.

SUMMARY

In a first aspect, a method of adjusting an audio signal for a communication device is provided. The method comprises: identifying a characteristic associated with the signal and identifying a quality threshold for the characteristic; identifying a first set of adjustment parameters for the signal for use when the quality threshold is exceeded; and identifying a second set of adjustment parameters for the signal for use when the quality threshold is not exceeded. Further, in the communication device, the method further comprises: monitoring for a current setting value for the characteristic; and detecting whether the current setting value is above or below the quality threshold. If the value is above, then the method processes the signal value to produce a first output signal value utilizing a digital signal processing device in the communication device, a processing filter defined in the digital signal processing device, values of the first set of adjustment parameters and the signal value. If the value is below, then the method processes the signal value to produce a second output signal value utilizing the digital signal processing device, the processing filter, values of the second set of adjustment parameters and the signal value.

In the method, the characteristic may be a volume level; the quality threshold may be a set volume level within operating parameters of the communication device; the filter may be a finite impulse response (FIR) filter; the first set of adjustment parameters may be a first set of coefficients for the FIR filter; and the second set may be a second set of coefficients for the FIR filter.

In the method, the first set may provide a set of coefficients to adjust the audio signal to comply with an audio frequency pass mask.

In the method, the audio frequency pass mask may be a mask compliant with GSM standards.

In the method, the second set may provide a set of coefficients to adjust the audio signal to roll off lower frequency components in the audio signal.

In the method, the second set may further provide a set of coefficients to further adjust the audio signal to boost higher frequency components in the audio signal.

In a second aspect, a system for adjusting an audio signal for a communication device is provided. The system comprises: a module to accept a request for change of volume for the audio signal; a module to receive the audio signal and convert the audio signal to a digitized audio signal; a microprocessor; a digital signal processor for processing the digitized audio signal and producing a digital output signal utilizing a filter, the digitized audio signal and a current set of parameters; an algorithm operating on the microprocessor; a module to convert the digitized audio signal to an analog audio signal; and to provide the analog audio signal to a speaker. The algorithm is adapted to: detect when the request for change of volume occurs; identify a new volume level being requested from the request; select a first set of adjustment parameters for the audio signal as a selected set if a volume threshold is exceeded; select a second set of adjustment parameters for the audio signal as the selected set if the volume threshold is not exceeded; and provide the selected set to the digital signal processor if the current set of parameters in the digital signal processor is different than the selected set.

In the system, the filter may be a finite impulse response (FIR) filter; the first set of adjustment parameters may be a first set of coefficients for the FIR filter; and the second set of adjustment parameters may be a second set of coefficients for the FIR filter.

In the system, the first set of adjustment parameters may provide a set of coefficients to adjust the audio signal to comply with an audio frequency pass mask.

In the system, the audio frequency pass mask may be a mask compliant with GSM standards.

In the system, the second set of adjustment parameters may provide a set of coefficients to adjust the audio signal to roll off lower frequency components in the audio signal.

In the system, the second set of adjustment parameters may further provide a set of coefficients to further adjust the audio signal to boost higher frequency components in the audio signal.

In other aspects, various combinations of sets and subsets of the above aspects are provided.

BRIEF DESCRIPTION OF THE DRAWINGS

The foregoing and other aspects of the invention will become more apparent from the following description of specific embodiments thereof and the accompanying drawings which illustrate, by way of example only, the principles of the invention. In the drawings, where like elements feature like reference numerals (and wherein individual elements bear unique alphabetical suffixes).

DETAILED DESCRIPTION OF AN EMBODIMENT

Figure 1:
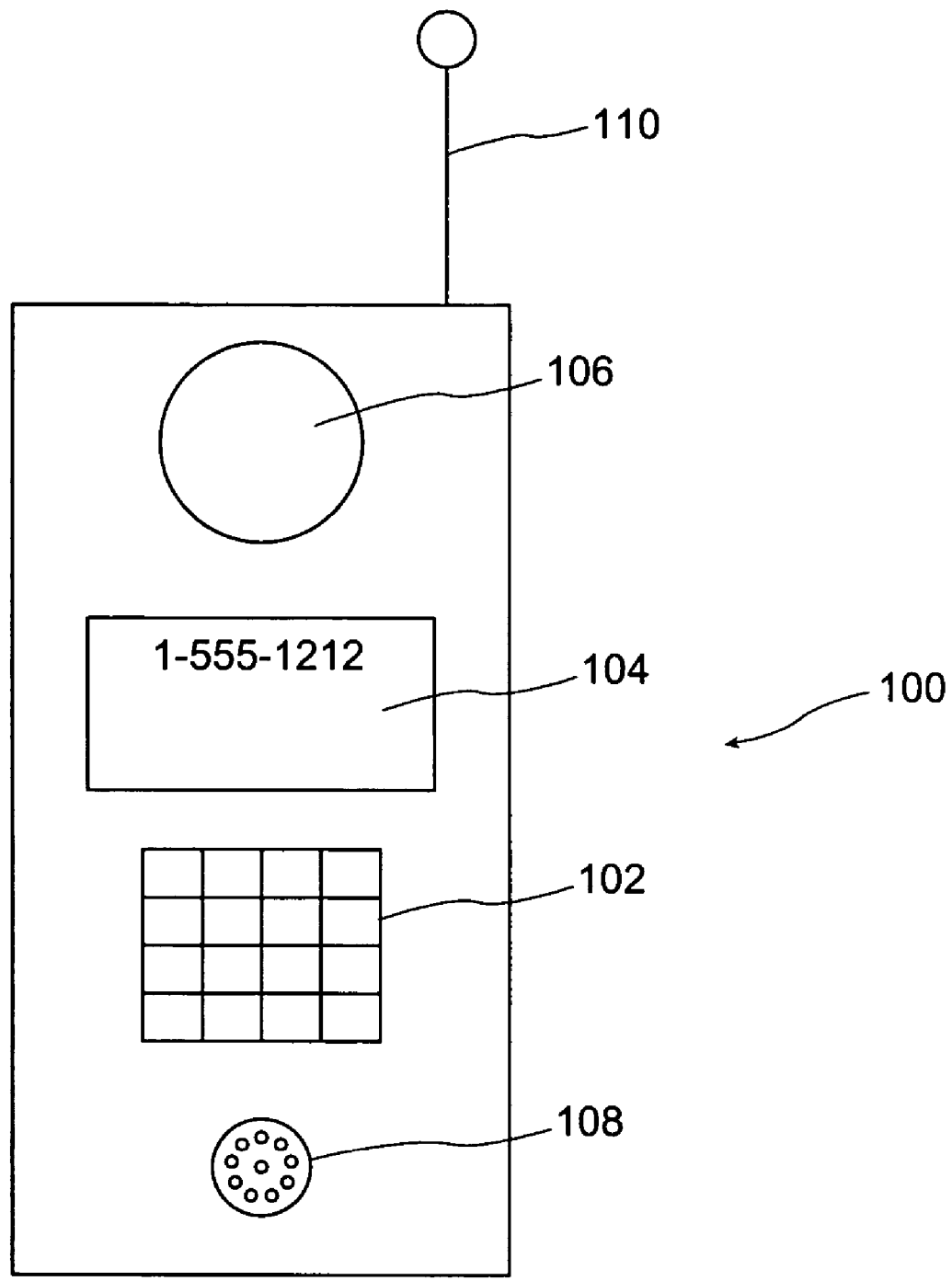
FIG. 1 is a block diagram of a communication device associated with an embodiment.

The description which follows, and the embodiments described therein, are provided by way of illustration of an example, or examples, of particular embodiments of the principles of the present invention. These examples are provided for the purposes of explanation, and not limitation, of those principles and of the invention. In the description, which follows, like parts are marked throughout the specification and the drawings with the same respective reference numerals.

Referring to FIG. 1, communication device 100 is shown. User of communication device 100 can establish a call with another person using another device which can communicate with device 100. Device 100 may be a telephone, cordless telephone, cellular phone, voice-enabled personal digital assistant or any device providing electronic voice communications. The other person may be using a device connected to a PSTN network (not shown). Therein, communications may be established through a cellular network (not shown) associated with device 100 and a PSTN network associated with the device of the other person. Alternatively, the other device may be a voice mail system.

The main interface elements of communication device 100 for its user include: keypad 102, display 104, speaker 106 and microphone 108. Speaker 106 generates all audible signals received from the other device. Microphone 108 receives all audio signals from the user as he speaks to the other person. Speaker 106 can be any type of speaker having appropriate dimensions and performance characteristics to produce an audio signal for device 100. For a wireless communication interface, antenna 110 is provided to receive and transmit wireless signals for device 100.

Figure 2:
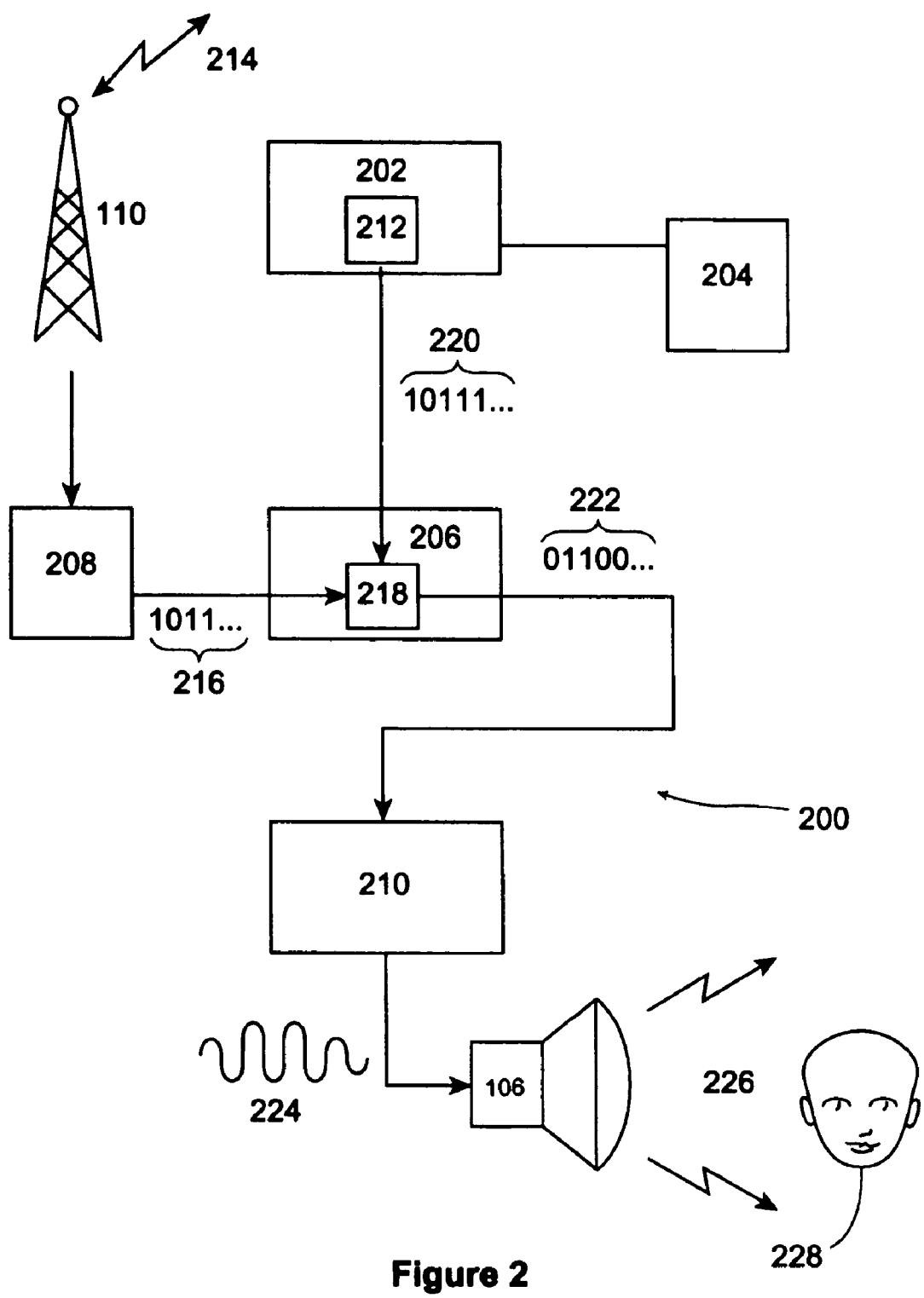
FIG. 2 is a schematic diagram of operational elements associated with the communication device of FIG. 1.

Referring to FIG. 2, further detail on functional aspects of elements in device 100 are provided. Therein, circuit 200 provides facilities to receive and transmit audio signals to and from device 100. Circuit 200 comprises microprocessor 202, non-volatile memory 204, digital signal processing (DSP) module 206, radio module 208, antenna 110, coder/decoder (CODEC) 210 and speaker 106.

Microprocessor 202 is the main control element for device 100. Algorithm 212 is a program operating on microprocessor 202, effectively providing control for many operations of device 100, including call control, display control and power management. Microprocessor 202 has access to memory 204, which is used to store routines, variables and data used by algorithm 212. In the embodiment, microprocessor 202 is a commercially available microcontroller, such as a microcontroller available from ARM, Motorola and Intel. Memory 204 is a flash memory device. Other technologies of non-volatile storage devices known in the art can be used. A representative DSP 206 is commercially available from various manufacturers, including Texas Instruments and Analog Devices. A representative CODEC 210 is commercially available from Texas Instruments and Analog Devices. A representative speaker 106 is commercially available from Philips and Foster.

For device 100, antenna 110 provides a wireless interface to receive and transmit voice signals encoded in radio frequencies to other devices. Antenna 110 is connected to radio module 208, which converts received wireless signals 214 received by antenna 110 into electrical signals, which can then be used by the other elements in circuit 200. In particular, module 208 converts received wireless signals 214 into digital data stream 216, which is a sufficient representation of the audio signal encoded in wireless signal 214. Similarly, data representing digitized audio signals spoken by the user and received by microphone 104 is received by radio module 208 then converted into an electrical signal for antenna 110, which then converts the electrical signal to a radio signal and transmits it to the air. Radio module 208 comprises internal circuits and routines known in the art of radio signal processing.

Digital data stream 216 is provided from radio module 208 to DSP 206, which is programmed to selectively shape the digitized voice signals to effect a required acoustic response properties for sounds meant for reproduction on speaker 106. At the heart of DSP 206 is filter 218, which provides an algorithm to process signal inputs (such as data 216) and apply set adjustment coefficients to aspects of the inputs, to produce output data stream 222. The adjustment coefficients are preferably provided by data 220 from microprocessor 202 as another set of inputs to DSP 206. With all of the input and coefficient information, DSP 206 uses its internal specialized DSP circuits to efficiently generate output data stream 222.

Thereafter output data stream 222 is provided to CODEC 210, which converts stream 216 to analog electrical signal 224, and then provides the electrical signal to speaker 106. Speaker 106 converts electrical signal 224 into audio signal 226, which can be heard by user 228.

It will be appreciated that other embodiments and processes also will provide an equivalent result of converting and processing a received radio frequency-based signal into an audible signal.

Further detail on specific adjustment coefficients provided by the embodiment is now provided. In the current regulatory environment, cellular phones and other wireless communication devices, such as device 100, generally must meet minimal operating performance specifications relating to the quality of audio signals produced by its speaker. Such audio specifications include signal frequency response and loudness rating standards.

Figure 3:
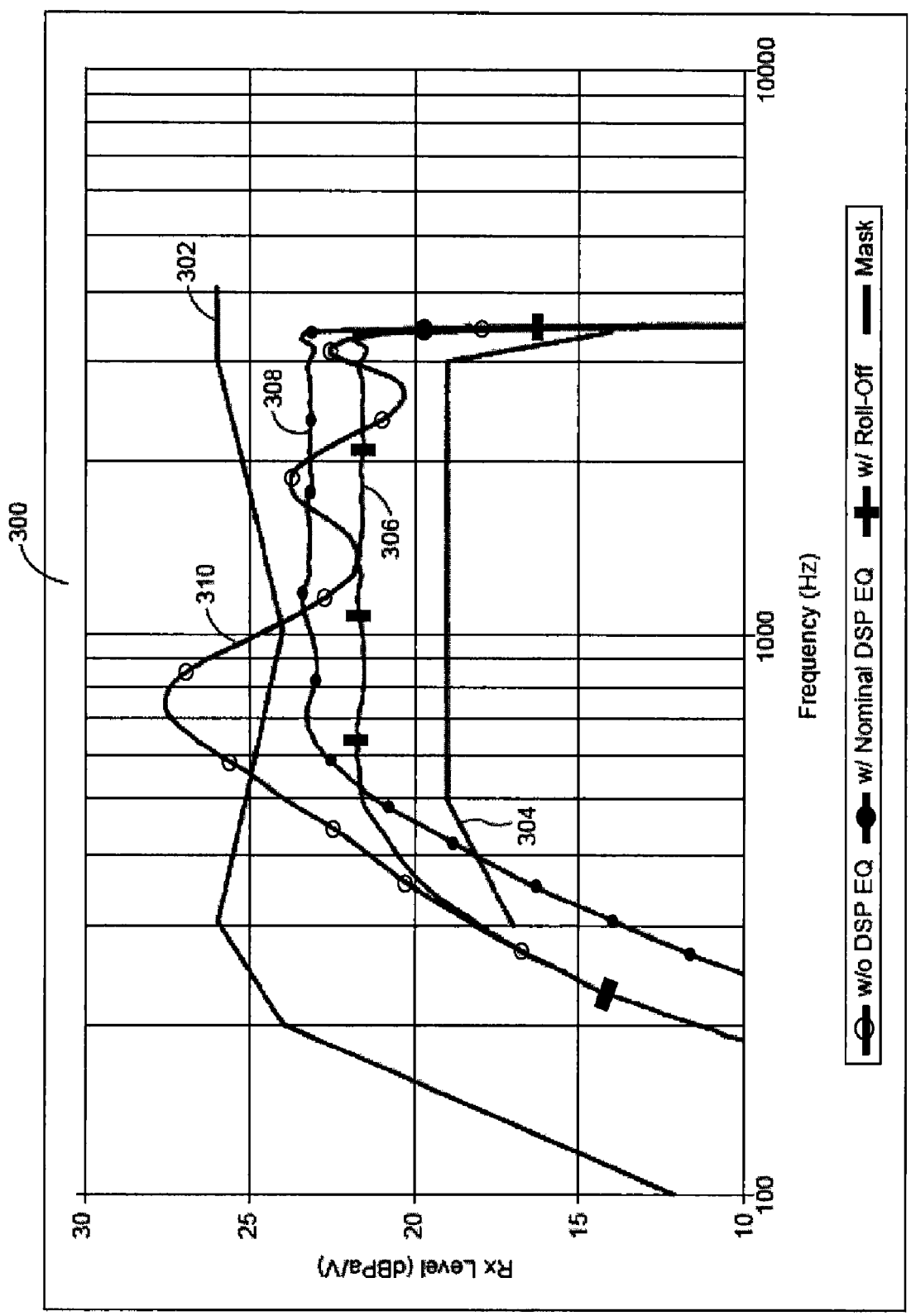
FIG. 3 is a frequency response curve illustrating responses for selected output levels of audio signals produced by the communication device of FIG. 1.

In FIG. 3, graph 300 is a receive frequency response graph defined under Globale Systems Mobile (GSM) standards. The receive frequency response standard mandates that the measured frequency response of a received signal (which is reproduced on speaker 106) falls within a specific mask (measured in dB) for a given frequency range. Specifically, the GSM standard dictates that for a communication device operating at the nominal volume setting, the frequency response of audio signals produced by its speaker must fall between a floating template defined by upper boundary 302 and lower boundary 304. Upper boundary 302 is a shaped frequency response curve defining acceptable and unacceptable response levels for given frequencies. For upper boundary 302, at a given frequency if the measured response level is above upper boundary 302, then the measured response fails the specification. Similarly, lower boundary 304 is a shaped frequency response curve defining acceptable and unacceptable response levels for given frequencies. For lower boundary 304, at a given frequency if the measured response level is below lower boundary 304, then the measured response fails the specification. The loudness standard is known as the Receive Loudness Rating (RLR). Specifically, the RLR dictates that for a communication device operating at a nominal volume setting, the RLR must be within a certain range. The calculation procedures for RLR are known in the art.

Frequency response curves 306, 308 and 310 are exemplary responses generated by speaker 106. Each curve represents speaker 106 being driven at one level but having different filter parameters being applied thereto by filter 218 and algorithm 212.

Frequency response curve 310 is the acoustic frequency response of speaker 106 with no filtering (i.e., with a flat filter response). Since the region of curve 310 about 650 Hz is not compliant with the frequency response mask specification, its audio drive signal requires equalization or shaping to make it compliant.

Frequency response curve 306 is the acoustic frequency response of speaker 106 with filter parameters applied for the nominal volume setting to provide compliance with the frequency response mask specification. As seen, curve 306 is compliant with the frequency response mask specification throughout its entire frequency range.

Frequency response curve 308 is the acoustic frequency response of speaker 106 for a different set of filter parameters. The region of curve 308 about 300 Hz is not compliant with the frequency response mask specification. Curve 308 shows that speaker 106 has lower output levels at the lower frequencies compared to curve 306. This is due to different shaping of the audio signal characteristic of the different set of filter parameters. Curve 308 has higher output levels than curve 306 in the frequency region above about 520 Hz. In that region, output values for that speaker have been boosted to compensate for the loss in loudness associated with the low frequency roll-off of the output level of curve 308 relative to curve 306. This compensation ensures that the user experiences the expected change in loudness, as determined by the Receive Loudness Rating (RLR), when the volume setting is switch from one volume level to its adjacent volume level and when filter parameters are switched.

Figure 4:
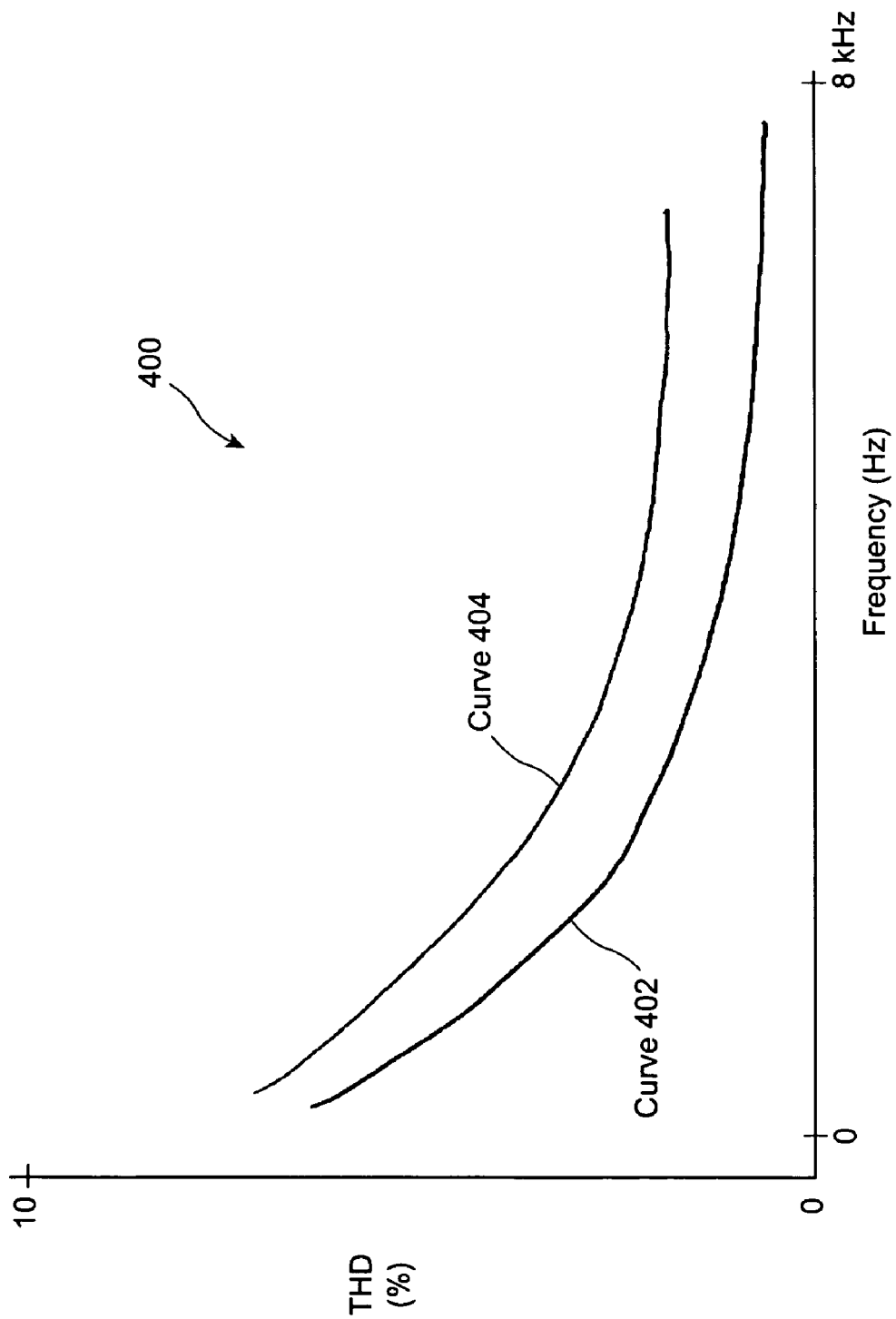
FIG. 4 is a harmonic distortion curve illustrating distortion levels for selected output levels of audio signals produced by the communication device of FIG. 1.

Referring to FIG. 4, for a given speaker producing a signal at a given volume level, a related issue to frequency response is the amount of distortion present in the signal. Generally, due to a speaker's inherent operational characteristics, as the volume of a signal reproduced on the speaker is increased, distortion in the audio signal increases. Limitations in the speaker include its operating frequency range and power handling capabilities. Often, for a given speaker having a given frequency operating range, signals in the lower frequencies are distorted first, due to physics relating to transducers. However, a speaker may also have sensitive elements for creating signals having higher frequencies. Accordingly, if the sensitive elements are damaged by high voltage signals, then the signals in the higher frequencies become distorted. Graph 400 shows total harmonic distortion (as a percentage) on the y-axis measured against a frequency range (in Hz) on the x-axis.

Curve 402 shows a representative curve of total harmonic distortion of a speaker driven at its nominal operating level. At its nominal operating level, it may have a frequency response as represented by curve 306 (FIG. 3).

When the speaker is driven at a higher loudness level, which is outside its nominal operating range, it may begin to distort the reproduced signals. Representative distortion levels are shown in curve 404. As seen in curve 404, distortion levels are higher in the lower frequency range than the higher frequency range. Accordingly, in order to more effectively reduce the distortion, it is advantageous to roll-off the lower frequencies in the signal.

Using frequency domain analysis techniques, in order to control the distortion, the embodiment effectively examines the current volume level of the audio signal being reproduced on speaker 106 (FIG. 2), and if the volume level exceeds a certain threshold, then certain aspects of the audio signal are attenuated to reduce the distortion. If the volume level is reduced to below the threshold, then the attenuation is removed. More specifically, when the volume level exceeds a predetermined threshold, device 100 effectively imposes a high-pass filter on the audio signal, thereby attenuating lower frequencies past a cut off band and not attenuating signals in frequencies past the cut off band. The shape and cut-off point of the high pass filter may be modified per different performance requirements. In other embodiments, low-pass filters, notch filters, band-pass filters, other types of filters or any combination of filters may be used.

For a given set of performance requirements, parameters must be established to set when a signal is attenuated and by how much. One method of identifying the characteristics is to measure the performance of the given speaker 106 under differing signal levels, by measuring its frequency response and distortion characteristics. The measurements are analyzed to identify volume levels which may produce excessive distortion and the associated frequency responses. Thereafter a cut-off volume level is selected. When the volume level of speaker 106 exceeds the cut-off volume, then signals are attenuated at certain frequencies. The identification of which frequencies require attenuation and what the attenuation amount should be is also determined by analyzing the measurements.

As an example, for speaker 106 operating at a given volume level, its frequency response is provided in graph 306 (FIG. 3) and its distortion level is provided in curve 404 (FIG. 4). To adjust the distortion characteristics of the audio signals generated at that given volume level, adjustments are made to the filter parameters to roll-off lower frequencies to produce curve 308, wherein curve 308 has a relatively flat response with upper boundary 302 and lower boundary 304. Curve 308 does fall outside lower boundary 304 in the lower frequencies; however, this may be an acceptable result. It will be appreciated that distortion of signal in curve 308 is lower than distortion of signals in curve 310.

While frequency domain analysis techniques are useful for identifying performance characteristics, time domain techniques may be used to implement a signal shaping algorithm. Signal shaping in the time domain allows use of DSP techniques to implement its shaping characteristics. Details regarding a digital implementation of the signal shaping is now provided.

Returning to FIG. 2, filter 218 is a basic block of DSP 206 and calculates attenuation values (if any) for signals sent to speaker 106. For filter 218, its frequency response in the frequency domain is governed by values of coefficients provided to its taps, as filter 218 processes data in the time domain. In programming these tap values, typically floating point numbers may be used. However, as filter 218 is implemented in hardware, the coefficients and the related data are represented as digital data in binary format. The operating guidelines of DSP 206 need to be followed to effect proper implementation of filter 218.

In the embodiment, a Finite Impulse Response (FIR) filter is used for filter 218. A FIR filter has an impulse response of finite duration. As is known in the art, the FIR filter uses a series of taps representing samples taken at different time intervals. The sampling rate for the embodiment is 8 kHz, providing a period of calculation of 125 us. This sampling rate is reasonable as the audio signals related to device 100 are in the telephone bandwidth of 0 to 3,400 Hz. In the embodiment, the FIR response uses 32 points. The mathematical structure of the FIR filter is the following difference equation:

$$y(n) = \sum_{i=0}^{N-1} [h(i) \times x(n-i)] \quad \text{Equation (1)}$$

Where x(i) is the input, y(n) is the output, h(i) is the unit sample response of the filter and N is the number of taps of the filter.

To determine the coefficients for the FIR filter, several known techniques may be used. As noted above, one technique is to conduct frequency measurements and determine a given cut-off frequency and shaping curve. Subsequently, the frequency domain information regarding the shaping curve may be converted to a set of coefficients in the time domain, using known techniques readily available in signal processing simulation software.

In the embodiment, Table A lists two sets of coefficients defined for device 100. The values in Table A are stored in non-volatile memory 204 and accessed by algorithm 212. Set 1 provides a set of coefficients which equalizes the acoustic response so that it complies with the GSM mask. In operation, the shaping would convert a response found in curve 310 (FIG. 3) to a response found in curve 306. Set 2 provides a set of coefficients which rolls-off lower frequencies to control distortion. In operation, the shaping would convert curve 310 to curve 308. As an enhancement, the overall gain between the two sets is adjusted so that a change in volume from one level to its adjacent level still provides the same change in loudness level that the users expects (for example, a 3 dB change).

TABLE A

| Tap | Set 1 | Set 2 |
|-----|-------|-------|
| 0   | 139   | 302   |
| 1   | -214  | -219  |
| 2   | 221   | 349   |
| 3   | -460  | -394  |
| 4   | 153   | 164   |
| 5   | -494  | -431  |
| 6   | -730  | -964  |
| 7   | 10    | -164  |
| 8   | -1145 | -1700 |
| 9   | 1666  | 1040  |
| 10  | 1356  | 541   |
| 11  | 919   | -481  |
| 12  | 611   | -836  |
| 13  | 455   | -1603 |
| 14  | 1047  | -875  |

TABLE A-continued

| Tap | Set 1 | Set 2 |
|-----|-------|-------|
| 15  | -1882 | -4470 |
| 16  | 28803 | 28803 |
| 17  | -1882 | -4470 |
| 18  | 1047  | -875  |
| 19  | 455   | -1603 |
| 20  | 611   | -836  |
| 21  | 919   | -481  |
| 22  | 1356  | 541   |
| 23  | 1666  | 1040  |
| 24  | -1145 | -1700 |
| 25  | 10    | -164  |
| 26  | -730  | -964  |
| 27  | -494  | -431  |
| 28  | 153   | 164   |
| 29  | -460  | -394  |
| 30  | 221   | 349   |
| 31  | -214  | -219  |

Figure 5:
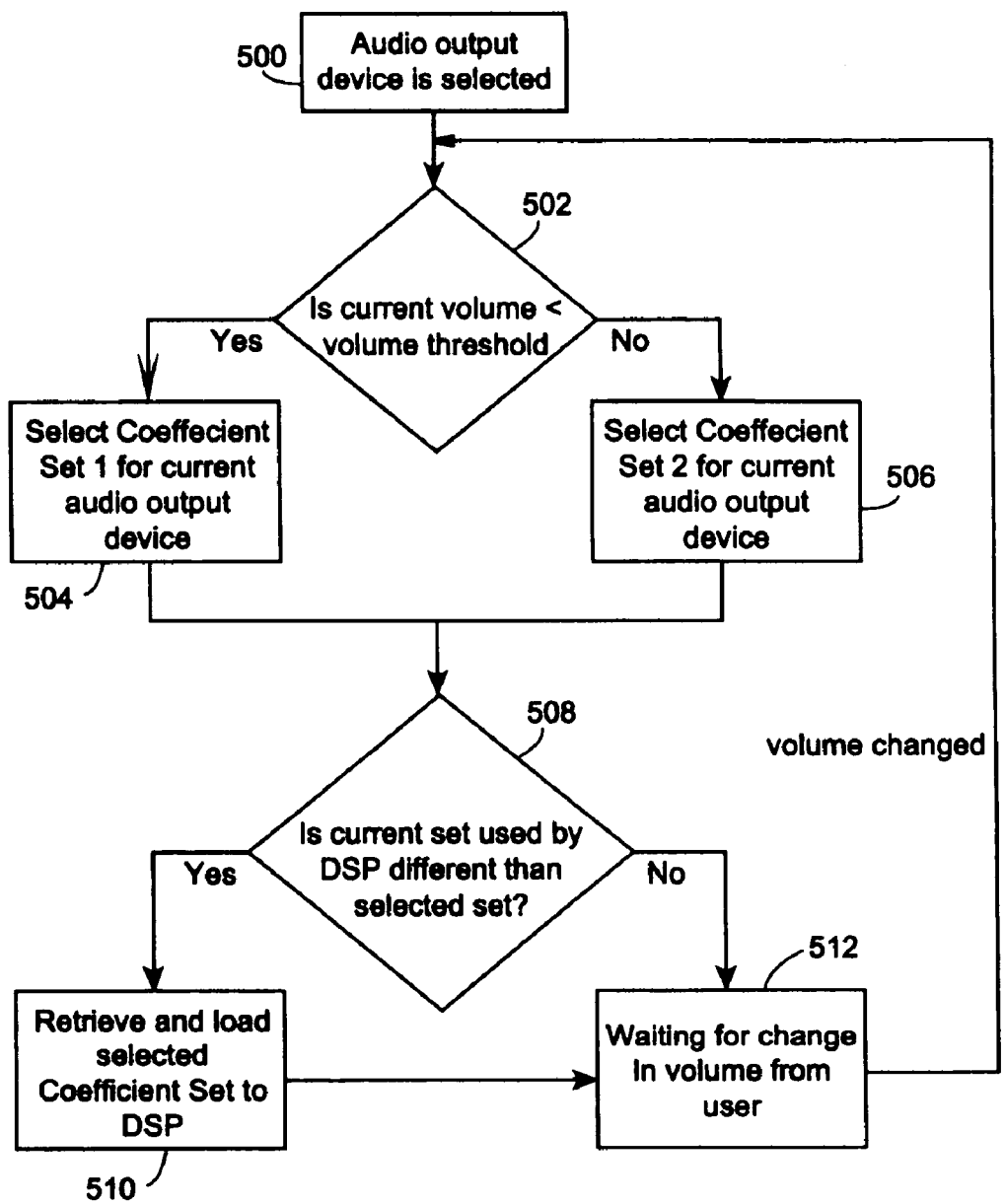
FIG. 5 is a flow chart of an algorithm used for adjusting signals used by the operational elements of FIG. 2.

Referring to FIG. 5, when operating device 100, a user-selectable volume control is typically provided to ensure the loudness rating can be adjusted to account for the level of the incoming audio signal and the hearing capabilities of the user. This volume control is typically implemented in uniform steps; steps of 3 dB per change are common. Algorithm 212 controls operation of tonal adjustments made to a signal in view of a particular volume setting. First, at step 500, the audio output device is selected. At step 502, algorithm 212 determines the current volume setting for device 100 and compares it with a threshold. If the volume is below the threshold, algorithm 212 selects Set 1, per step 504. DSP 206 coordinates acceptance of the tap values and the incoming data values in data stream 218. However, per step 506, if algorithm 212 detects that the volume level exceeds the threshold, then Set 2 is selected. After either step 504 or 506, algorithm 212 goes to step 508 and checks whether the currently loaded Set of coefficients is different than the selected Set. If the currently loaded Set is different, then step 510 is executed and the selected Set (either Set 1 or 2) is retrieved from memory and provided to DSP 206. Thereafter, the operating cycles for DSP 206 generates the adjusted audio signal (in digital form). Thereafter, at step 512, device 100 waits for a change in volume levels. Upon detection of a change, algorithm 212 returns to step 502. It will be appreciated that each time a volume control is selected by a user for device 100, the volume level is used to determine which download filter coefficients are to be provided to DSP 206. In the embodiment, a volume setting of "7", (in a 0-10 scale where a volume setting of "5" is defined as nominal and each step provides a 3 dB volume steps), is selected as the threshold point. Other embodiments may use other volume steps or additional sets of coefficients for different volume levels. Other embodiments may use variations on the flow of operations, while still achieving signal shaping, from the algorithm noted above. Other embodiments may use more sets of coefficients.

It will be appreciated that the embodiment provides an effective and simple shaping routine for potentially distorted signals. Other embodiments may use other digital filters, such as an Infinite Impulse Response (IIR) filter, which are known in the art.

Although the embodiment provides adjustment for distortion control, other embodiments may be used to adjust for other settings. Such other settings include, without limitation: a signal boost for selected signals; volume adjustment; gain adjustment; a programmable gain amplifier (PGA) steps adjustment; side tone frequency adjustment; switching adjustments; specific frequency suppression adjustment; and adjustment for specific microphone parameters.

The above embodiment is useful for tuning speaker performance in production models of device 100. During production runs of device 100, different types of speakers 106 may be used in different manufacturing batches. Accordingly, for a given model of speaker 106, the above method may be used to determine one set of performance characteristics and a set of signal shaping parameters are provided for that model. When device 100 is built using that given model, the parameters for that model are used to attenuate the volume signals. However, when a second speaker model is used, then the method is used to determine its set of performance characteristics and signal shaping parameters. Accordingly, different adjustment parameters are provided to device 100 when that second speaker is used.

At a general level, the embodiment identifies a characteristic associated with an audio signal and identifies a quality threshold for the characteristic. Adjustment parameters are set for the signals. When the characteristic is exceeded, the DSP is provided with a set of parameters to reduce the unwanted factor associated with the signal to produce an adjusted signal where the unwanted factor is lessened. When the characteristic is not exceeded, the DSP is provided with another set of parameters which may not necessarily provide an output signal which needs to account for the unwanted factor.

At a more specific level, the embodiment monitors for a change in a volume level for a communication device. If the volume level is below a predetermined threshold, then DSP 206 is provided with a set of coefficients to shape the audio signal to conform with an audio frequency pass mask, such as the mask illustrated in FIG. 3. If the volume level exceeds the threshold, then there may be distortion in the signal. As such, the lower frequency signals in the signal are rolled-off in a preset fashion to reduce the amplitude of the lower frequency signals. This has the effect of lessening any distortion in the signal. However, the rolled-off signal has less loudness associated with it. As such, the signal is boosted in its higher frequencies in a preset fashion to compensate for the removed energy from the signal. The resulting rolled-off and boosted signal provides a signal which mimics a step-wise increase in volume (e.g. a 3 dB increase in loudness).

It will be appreciated that in another embodiment, signals may be step-wise attenuated as volume levels are decreased with an appropriate modification to the signals to ensure compliance with a mask.

Although the invention has been described with reference to certain specific embodiments, various modifications thereof will be apparent to those skilled in the art without departing from the scope of the invention as outlined in the claims appended hereto.

We claim:

1. A method of adjusting an audio signal for a communication device, said method comprising:
    identifying a volume level associated with said audio signal and
    identifying a set volume level within operating parameters of said communication device;
    identifying a first set of adjustment parameters for said volume level to be used when said set volume level is exceeded;
    identifying a second set of adjustment parameters for said volume level to be used when said set volume level is not exceeded; and
    in said communication device:
        obtaining a digitized signal value of said audio signal;
        monitoring for a change in said volume level;
        upon determining that implementing said change in said volume level would exceed said set volume level
            processing said signal value to produce a first output signal value utilizing a digital signal processing (DSP) device in said communication device, a processing filter defined in said digital signal processing device, values of said first set of adjustment parameters and said signal value;
        and
        upon determining that implementing said change in said volume level would not exceed said set volume level
            processing said signal value to produce a second output signal value utilizing said DSP, said processing filter, values of said second set of adjustment parameters and said signal value; and
            generating said second output signal to implement said increased volume level utilizing said second set of adjustment parameters,
    wherein said first output signal and said second output signal both implement said change in said volume level.

2. The method of adjusting an audio signal for a communication device, as claimed in claim 1, wherein:
    said processing filter is a finite impulse response (FIR) filter;
    said first set of adjustment parameters is a first set of coefficients for said FIR filter; and
    said second set of adjustment parameters is a second set of coefficients for said FIR filter.

3. The method of adjusting an audio signal for a communication device, as claimed in claim 2, wherein said first set of adjustment parameters provides a set of coefficients to adjust said audio signal to comply with an audio frequency pass mask.

4. The method of adjusting an audio signal for a communication device, as claimed in claim 3, wherein said audio frequency pass mask is a mask compliant with GSM standards.

5. The method of adjusting an audio signal for a communication device, as claimed in claim 4, wherein said second set of adjustment parameters provides a set of coefficients to adjust said audio signal to roll off lower frequency components in said audio signal.

6. The method of adjusting an audio signal for a communication device, as claimed in claim 5, wherein said second set of adjustment parameters provides a set of coefficients to further adjust said audio signal to boost higher frequency components in said audio signal.

7. A system for adjusting an audio signal for a communication device, said system comprising:
    a module to accept a request for change of volume for said audio signal;
    a module to receive said audio signal and convert said audio signal to a digitized audio signal;
    a microprocessor;
    a digital signal processor for processing said digitized audio signal and producing a digital output signal utilizing a filter, said digitized audio signal and a set of parameters;
    a first module providing a set of instructions operating on said microprocessor, said set of instructions:
        determining when said request for change of volume occurs;
        identifying a new volume level for said audio signal for said request;

upon determining that implementing said new volume level would exceed a set volume level within operating parameters of said communication device
processing said volume level to produce a first output volume level through said digital signal processing using a first set of adjustment parameters as said set of parameters and said new volume level; and upon determining that implementing said new volume level would not exceed said set volume level
processing said volume level to produce a second output volume level utilizing said digital signal processor and a second set of adjustment parameters as said set of parameters and said new volume level; and
providing said set of parameters to said digital signal processor if a current set of parameters in said digital signal processor is different than said selected set; and a second module to convert said digitized audio signal to an analog audio signal and to provide said analog audio signal to a speaker, wherein said first output signal and said second output signal both implement said change in said volume level.

8. The system for adjusting an audio signal for a communication device as claimed in claim 7, wherein:
said filter is a finite impulse response (FIR) filter;
said first set of adjustment parameters is a first set of coefficients for said FIR filter; and
said second set of adjustment parameters is a second set of coefficients for said FIR filter.

9. The system for adjusting an audio signal for a communication device, as claimed in claim 8, wherein said first set of adjustment parameters provides a set of coefficients to adjust said audio signal to comply with an audio frequency pass mask.

10. The system for adjusting an audio signal for a communication device, as claimed in claim 9, wherein said audio frequency pass mask is a mask compliant with GSM standards.

11. The system for adjusting an audio signal for a communication device, as claimed in claim 10, wherein said second set of adjustment parameters provides a set of coefficients to adjust said audio signal to roll off lower frequency components in said audio signal.

12. The system for adjusting an audio signal for a communication device, as claimed in claim 10, wherein said second set of adjustment parameters provides a set of coefficients to further adjust said audio signal to boost higher frequency components in said audio signal.

13. A circuit for adjusting an output audio signal of a communication device, said circuit comprising:
a module for receiving a signal encoding an audio signal and convening said signal to a digitized signal;
a module to accept a request for an increase in a current volume setting to an increased volume level for said output audio signal;
a microprocessor provided with instructions to detect when said request for said increase occurs and to generate an adjusted version of digitized signal to implement said increased volume level utilizing a digital signal processor (DSP); a filter; and said digitized signal; and
a module to convert said adjusted version of the digitized signal to an analog audio signal and to provide said analog audio signal to a speaker,
the circuit
determining if said request for said increase at said increased volume level would generate an audio output signal which exceeds a predetermined quality threshold;
upon determining that said increased volume is within said quality threshold, selecting a first set of adjustment parameters to be used by said digital signal processor to generate an adjusted version of said digitized signal to implement said increased volume having a received loudness rating (RLR) level; and
upon determining that said increased volume would cause said output audio signal to exceed said quality threshold, selecting a second set of adjustment parameters to be used by said digital signal processor to generate another adjusted version of said digitized signal that provides different output levels for said digitized signal at different frequencies as compared to said adjusted version to have an acceptable characteristic for said quality threshold while implementing said increased volume at about said RLR level.

14. The circuit as claimed in claim 13, wherein:
said quality threshold is associated with an audio frequency pass mask;
said acceptable characteristic is a frequency response within an acceptable boundary of said audio frequency pass mask;
said filter is a finite impulse response (FIR) filter;
said first set of adjustment parameters is a first set of coefficients for said FIR filter; and
said second set of adjustment parameters is a second set of coefficients for said FIR filter.

15. The circuit as claimed in claim 14, wherein said audio frequency pass mask is compliant with GSM standards.

16. The circuit as claimed in claim 15, wherein said second set of adjustment parameters comprises a set of coefficients to roll off lower frequency components in said audio signal.

17. The circuit as claimed in claim 16, wherein said second set of adjustment parameters further comprises a set of coefficients to boost higher frequency components in said audio signal.

18. The circuit as claimed in claim 13, wherein:
said quality threshold is a boundary associated with one of the following attributes relating to said audio signal:
a signal boost for selected signals;
gain adjustment;
side tone frequency adjustment;
switching adjustments;
signal suppression; and
adjustments for a microphone in said communication device;
said filter is a finite impulse response (FIR) filter;
said first set of adjustment parameters is a first set of coefficients for said FIR filter; and
said second set of adjustment parameters is a second set of coefficients for said FIR filter.

* * * * *